United States Patent [19]

Plog

[11] 4,137,467
[45] Jan. 30, 1979

[54] SENSOR INTERFACE CIRCUIT

[75] Inventor: Richard J. Plog, Peshtigo, Wis.

[73] Assignee: The Ansul Company, Marinette, Wis.

[21] Appl. No.: 795,807

[22] Filed: May 11, 1977

[51] Int. Cl.² .................... H03K 1/14; H03K 5/00
[52] U.S. Cl. .................... 307/264; 307/252 F; 307/308; 307/350; 307/DIG. 1; 340/598
[58] Field of Search .................... 307/252 F, 264, 284, 307/308, 350, DIG. 1; 340/227 R; 328/3, 6

[56] References Cited

U.S. PATENT DOCUMENTS 3,889,161  6/1975  Trush .................... 307/252 F

Primary Examiner—John Zazworsky
Attorney, Agent, or Firm—Morgan, Finnegan, Pine, Foley & Lee

[57] ABSTRACT

A circuit for interfacing with sensors having a loop current flowing therethrough comprising a current mirror utilizing multiple diode-connected transistors for dividing the loop current into several equal subparts and means connected to said current mirror for producing a latching output signal when the current equal to one subpart of the loop current exceeds a predetermined value.

5 Claims, 1 Drawing Figure

SENSOR INTERFACE CIRCUIT

BACKGROUND AND BRIEF DESCRIPTION OF THE INVENTION

The present invention relates to an interface circuit and, more particularly, to an interface circuit for fire alarm, security or other single or multiple sensors connected in parallel.

In most sensor systems, one or more sensors are connected to a common monitor/control device via an interface circuit. The interface circuit between the electrical loop formed by the sensors and the monitor/control device must sense when the loop current exceeds a predetermined value and produce an appropriate output signal at that time, the loop current being determined by the number and type of sensor in the loop.

Conventional interface circuits perform a current to voltage conversion and use voltage comparison techniques to monitor the voltage developed across a known resistance through which the loop current is flowing. This requires either a high power resistor or a precision small resistor to accomplish the conversion and changes the voltage applied to the loop when the loop load changes, which in turn changes the sensitivities trip point of the monitoring devices or sensors across the loop. The voltage which is developed across the sensing resistor is amplified and applied to a latching device within the interface circuit, the latching device typically being a relay. Temperature dependent gains of transistors, amplifiers and comparators used in these circuits greatly affect the accuracy with which the loop current levels can be determined.

This present invention monitors an accurate fraction of the loop current by using multiple diode-connected transistors directly in the loop path which reflect a fraction of the loop current into a current mirror and eliminates the need for high power or precision small resistors in the current to voltage conversion circuit. Power consumption within the interface circuit remains low, eliminating the changing resistance problem associated with power dissipation in the sensing resistor and close proximity parts, thereby improving accuracy. The use of a current mirror passing only a part of the loop current reflected by the diode-connected transistors rather than sensing resistors provides high temperature stability and causes a constant voltage to be maintained across the sensor loop, thereby eliminating the problem of monitoring devices changing sensitivities as one or more of the sensors in the loop actuate. Current limiting reduces the complexity of the mating control equipment and provides protection for the devices in the loop. A solid state latching function within the interface circuit increases reliability and reduces size and cost.

BRIEF DESCRIPTION OF THE DRAWING

The invention is disclosed herein in conjunction with the drawing which forms a part of the specification and which is a schematic block diagram of one exemplary embodiment of the present invention.

DETAILED DESCRIPTION

Figure 1:
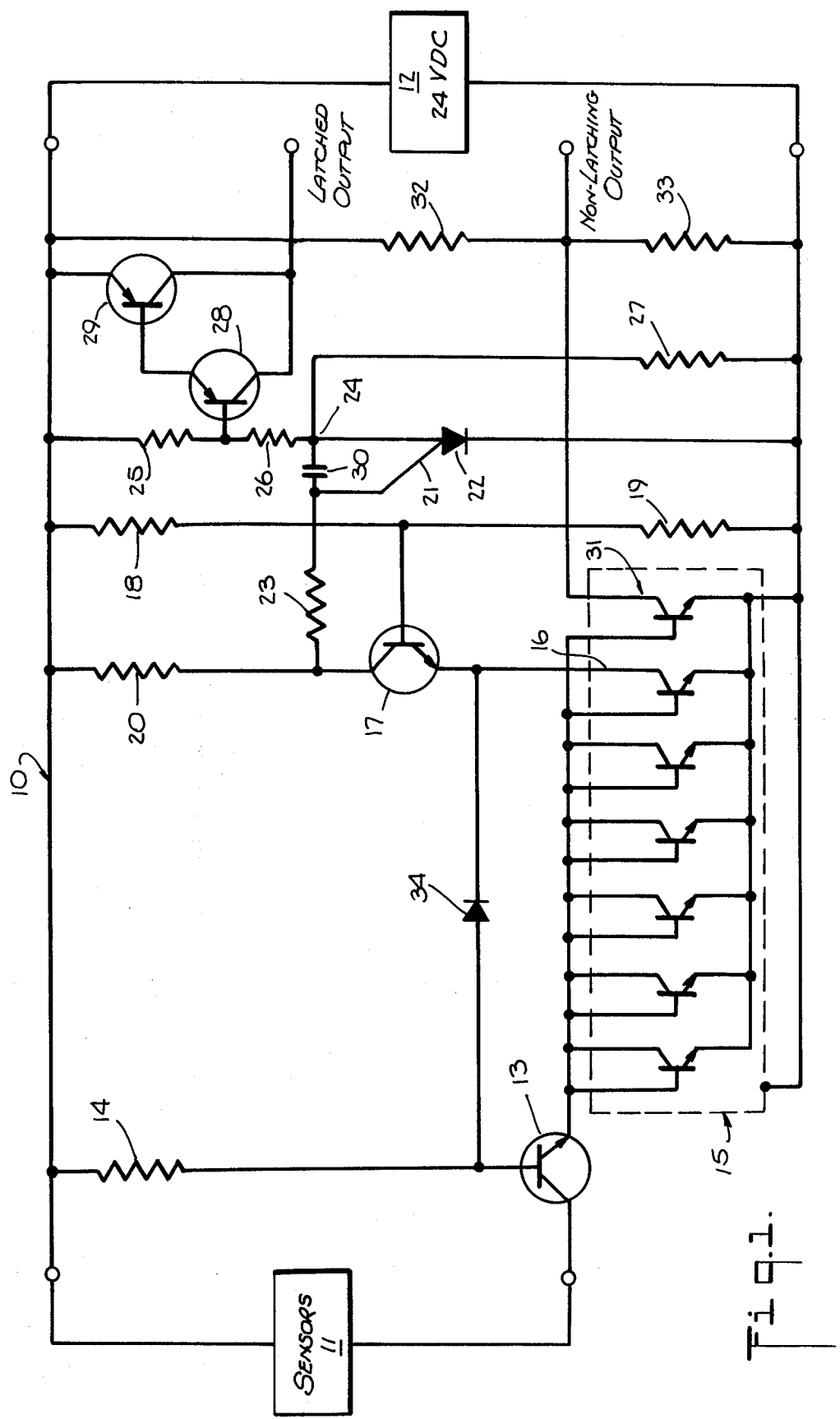

Referring to the drawing, there is set forth a schematic block diagram of one exemplary embodiment of the present invention. The interface circuit 10 is connected to one or more sensors 11. In addition, a 24 volt DC supply 12 is also connected to the interface circuit for supplying power to the circuit and the sensors.

The loop current flows through sensors 11, which may comprise heat and/or smoke detectors, and returns to the interface circuit through transistor 13 which is normally saturated and acts as a solid state switch. Transistor 13 is held in saturation by biasing resistor 14 which supplies the base drive thereto. The loop current is passed by transistor 13 to a seven transistor array 15. The first five of the seven transistors are connected as "diode-connected transistors" and the remaining transistors are connected as "current mirrors". The diode-connected transistors divide the loop current into five equal subparts and, in addition, cause an amount equal to one-fifth of the loop current to be reflected and flow in the collectors of each of the remaining two transistors in the array. For a more detailed description of current mirrors see, e.g., the RCA Solid State Databook Series, SSD-202A, Linear Integrated Circuits and MOS Devices, 1973 Edition, pages 311 to 317 and 325 to 326.

The seven transistor array 15 may, for example, be an RCA CA3081 integrated circuit device which consists of seven silicon n-p-n transistors on a common monolithic substrate. The transistors are connected in common-emitter configuration. Because the transistor array 15 comprises identical transistors on a common substrate, the diode-connected transistors evenly distribute the base drive currents and cause equal currents to flow in the collectors of all seven transistors in array 15. Errors due to ambient temperature variations are almost nonexistent because the transistors in array 15 are matched and the five diode-connected transistors act as on-chip heaters to maintain a constant cross-section of temperature across the chip.

The collector 16 of the sixth transistor in array 15 is floated at the emitter potential of transistor 17 which is biased by a divider network formed by resistors 18 and 19. The same current flows in the collector resistor 20 of transistor 17 as flows in the collector 16 of the sixth transistor in array 15. The current to voltage conversion is preformed using resistor 20 and a low level current which accurately reflects the loop current, being equal in this case to one-fifth of the loop current.

The voltage developed at the collector of transistor 17 is applied to the gate 21 of programmable solid state latching switch 22 through an isolation resistor 23. When the voltage at the gate 21 of switch 22 falls below the reference voltage 24 developed by the divider network comprising resistors 25, 26 and 27, switch 22 changes from a high to a low impedance which causes a forward bias to be applied to the base of output drive transistors 28 and 29. A capacitor 30 is connected between the gate and anode of switch 22. After switch 22 has changed to a low impedance state, resistors 25 and 26 provide sufficient current to keep switch 22 in the low impedance state and to cause drive transistors 28 and 29 to provide a continuous, latched output signal.

The collector 31 of the seventh transistor in array 15 also passes an accurate fraction of the loop current, in this case one-fifth, for external monitoring purposes. This non-latching current output can be converted to a non-latching voltage output using divider resistors 32 and 33.

Current limiting is accomplished with saturation of the first floating collector 16 of array 15 which causes diode 34 to be forward biased, thereby removing base drive from transistor switch 13. Switch 13 changes from a low impedance to a high impedance state and limits the loop current to a predetermined maximum. The point at which current limiting occurs is determined by the value of sensing resistor 20. Instead of a single fixed resistor one may also employ a series of sensing resistors, in combination with a switch, or an adjustable potentiometer to set the current limiting point.

The loop current level required to cause latching of programmable switch 22 is determined by the values of divider resistors 25, 26 and 27. Alternatively, a switch combined with a tapped resistive divider network or a potentiometer in the divider network may be employed to set the current level.

The non-latching control output can be a direct, accurate fractional loop current output to an external control function. It may also be a fixed reference voltage level determined by divider resistors 32 and 33. By employing a potentiometer, a variable reference can also be provided.

Typical circuit component values are:

| Device | Type |
|---|---|
| 13 | TIP 29A |
| 15 | CA 3081 |
| 17 | 2N 2222 |
| 22 | 2N 6028 |
| 28 and 29 | 2N 2907 |
| 34 | IN 4148 |
| Capacitor | Value |
| 30 | 0.1 microfarad |
| Resistor | Value |
| 14 | 10K |
| 18, 19 and 23 | 100K |
| 20 | 1.2K |
| 25 | 1K |
| 26 | 12K |
| 27 | 33K |
| 32 | 8.2K |
| 33 | 20K |

The invention is defined by the claims and is not limited to the exemplary embodiment disclosed herein since modifications will undoubtedly occur to those skilled in the art.

What I claim is:

1. A circuit for interfacing with sensors having a loop current flowing therethrough comprising:
   (a) integrated circuit means having
      (i) a plurality of transistors connected as diodes for dividing said loop current into several equal subparts,
      (ii) at least one additional transistor connected to said diode-connected transistors so that a current equal to one subpart of said loop current is caused to flow through said additional transistor; and
   (b) latching means connected to said additional transistor and responsive to said current equal to one subpart of said loop current for developing a latching output signal when said current equal to one subpart of said loop current exceeds a predetermined value.

2. A circuit according to claim 1 wherein said integrated circuit means includes a second additional transistor connected to said diode-connected transistors so that a second current equal to one subpart of said loop current is caused to flow through said second additional transistor for producing a non-latching output signal proportional to said loop current.

3. A circuit according to claim 1 wherein said latching means comprises a programmable solid state latching switch.

4. A circuit according to claim 1 wherein said plurality of transistors comprises at least four transistors for dividing said loop current into at least four equal parts.

5. A circuit for interfacing with sensors having a loop current flowing therethrough comprising:
   (a) integrated circuit means having
      (i) at least four transistors connected as diodes for dividing said loop current into at least four equal subparts,
      (ii) a first additional transistor connected to said diode-connected transistors so that a current equal to one subpart of said loop current is caused to flow through said first additional transistor;
      (iii) a second additional transistor connected to said diode-connected transistors so that a second current equal to one subpart of said loop current is caused to flow through said second additional transistor for producing a non-latching output signal proportional to said loop current; and
   (b) latching means connected to said first additional transistor and responsive to said current equal to one subpart of said loop current for developing a latching output signal when said current equal to one subpart of said loop current exceeds a predetermined value.

UNITED STATES PATENT AND TRADEMARK OFFICE
CERTIFICATE OF CORRECTION

PATENT NO. : 4,137,467
DATED : January 30, 1979
INVENTOR(S) : Richard J. Plog

It is certified that error appears in the above—identified patent and that said Letters Patent are hereby corrected as shown below:

Column 1, line 26: before "trip" insert --or--;

Column 2, line 39: change "preformed" to --performed--.

Signed and Sealed this

Twenty-ninth Day of May 1979

[SEAL]

Attest:

RUTH C. MASON
*Attesting Officer*

DONALD W. BANNER
*Commissioner of Patents and Trademarks*